May 19, 1970 L. R. RUDOLPH 3,513,407

TUNED FILTER AMPLIFIER

Filed Oct. 28, 1968

INVENTOR

LOUIS R. RUDOLPH

BY [signature]

ATTORNEY

United States Patent Office 3,513,407

Patented May 19, 1970

3,513,407

TUNED FILTER AMPLIFIER

Louis R. Rudolph, Annandale, Va., assignor to the United States of America as represented by the Secretary of the Navy Filed Oct. 28, 1968, Ser. No. 771,066
Int. Cl. H03f *1/00, 3/68*
U.S. Cl. 330—69 4 Claims

ABSTRACT OF THE DISCLOSURE

A tuned filter amplifier including a tuned input filter, comprising two capacitors and an inductor connected in a series closed-loop, and a differential amplifier whereby signals within a pass band of the tuned input filter are amplified while signals outside the pass band are suppressed. The input impedance of the tuned filter amplifier is approximately determined by the input impedance of the differential amplifier and is constant.

Figure 1:
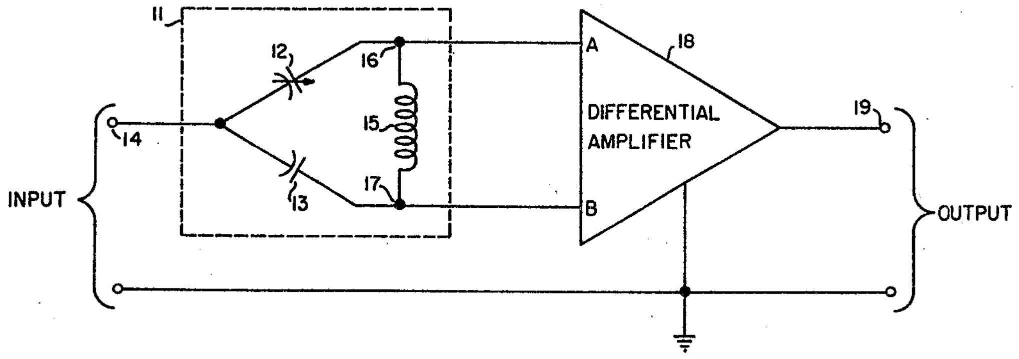

The invention described herein may be manufactured and used by or for the Government of the United States of America for governmental purposes without the payment of any royalties thereon or therefor.

BACKGROUND OF THE INVENTION

The present invention relates generally to improvements in tuned amplifiers and the like and more particularly to a new and improved tuned filter amplifier wherein the input impedance of the amplifier is high and remains constant regardless of the frequency of input signals applied thereto.

Many tuned amplifier systems require a constant high input impedance. Where successive tuned stages are connected in cascade, for example, any variation in the input impedance of the last stage will adversely affect its preceding stage and so on up the line. In addition, where many tuned filters connected to a common input are used to separate multifrequency telemetry data signals, the variation in the input impedance, and the resultant variation in the loading of the source of the telemetry signals, causes a serious degradation of the accuracy of the information contained therein.

It has been the general practice, in systems similar to those outlined above where a tuned amplifier having a constant high input impedance is desired, to employ a separate isolation amplifier directly preceding the tuned amplifier. Although such devices have served the purpose, they have not proved entirely satisfactory under all conditions of service since an additional number of components are required for the isolation amplifier. This takes up additional space, which is critical in many applications, and results in higher costs. Furthermore, the input impedance characteristics of conventional tuned amplifiers present many burdensome problems to the design engineer which again results in higher costs.

SUMMARY OF THE INVENTION

The general purpose of this invention is to provide a tuned filter amplifier which embraces all the advantages of similarly employed prior art devices and possesses none of the aforedescribed disadvantages. To obtain this, the invention uses a unique closed-loop series circuit tuned filter in conjunction with a differential amplifier whereby the input impedance of the differential amplifier approximately determines the input impedance of the tuned filter amplifier combination regardless of the frequency of the applied input signals.

The invention thus provides all the attendant advantages of prior art circuits containing many more components; e.g., isolation amplifiers or high insertion loss resistive components, and can be inexpensively and reliably microminiaturized to be compatible with many modern systems.

Accordingly, it is one object of the present invention to provide a tuned amplifier having constant high input impedance.

Another object is the provision of a band pass filter amplifier having a high input impedance for all frequencies both inside and outside the pass band.

A further object is to provide a tuned filter amplifier having few parts and being readily adaptable to microminiaturization.

It is a still further object of the present invention to provide a tuned filter amplifier having negligible effect on the characteristics of similar circuits when fed from a common input.

Figure 3:
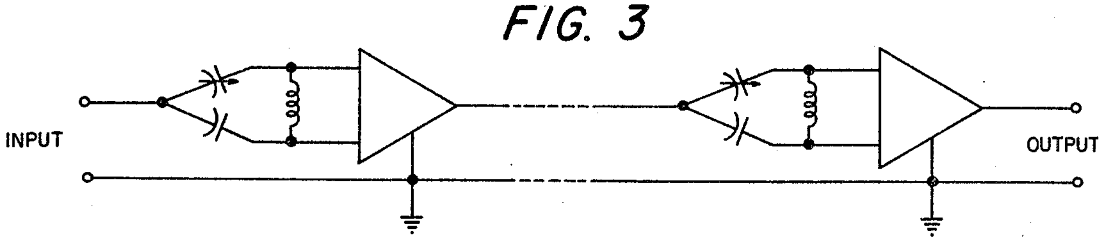
Figures 2A, 2B, 2C:
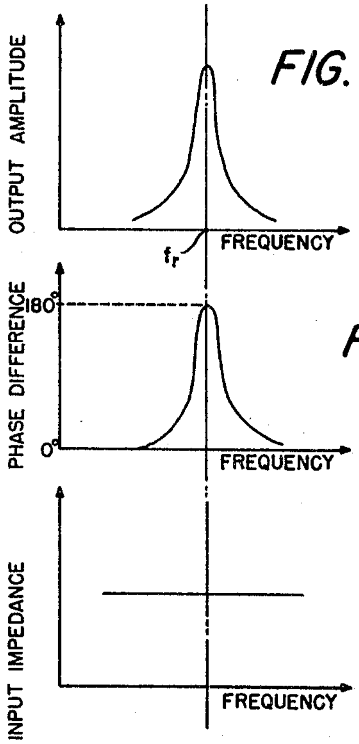
Figure 4:
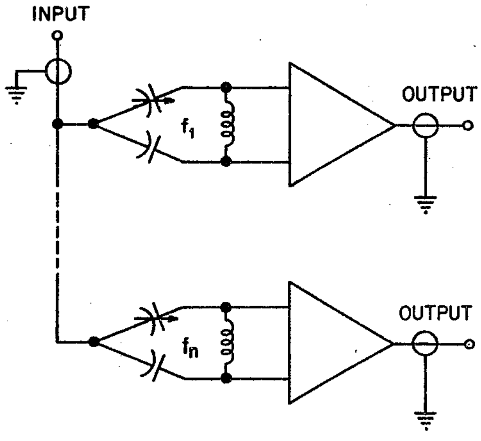

Other objects, advantages and noval features of the invention will become apparent from the following detailed description of the invention when considered in conjunction with the accompanying drawings wherein:

FIG. 1 is a schematic diagram, partly in block form, of the preferred embodiment of the invention;

FIGS. 2*a*, 2*b* and 2*c* are graphs which illustrate the principles of operation of the device of FIG. 1;

FIG. 3 is a frequency separator using the preferred embodiment of the invention shown in FIG. 1; and FIG. 4 is a cascade circuit employing the invention of FIG. 1.

DESCRIPTION OF THE PREFERRED EMBODIMENT

Referring now to the device illustrated in FIG. 1, there is shown a tuned filter 11 which includes capacitors 12 and 13 connected together at one end to form an input terminal 14 and connected at their other ends across inductor 15 to form two junctions 16 and 17. The filter has a resonant frequency, $f_r$, which is determined according to the conventional formula:

$$f_r=\frac{1}{2\pi\sqrt{LC}}$$

where L is the value of inductor 15 and C is the value of the series combination of capacitors 12 and 13. It is noted that one of the two capacitors 12 and 13 has a value which is much larger than the other to provide the phase vs. frequency characteristics described below. Capacitor 12 is variable, illustrating one way that the resonant frequency of the filter may be adjusted. As is well known, the value of either capacitor 12 or 13 or inductor 15 may be varied to adjust the resonant frequency.

When signals are applied to input terminal 14, output signals are produced by the filter at junctions 16 and 17. These signals are identical in amplitude but differ in phase. Referring to FIG. 2*b*, there is illustrated the dependency of the phase difference between junctions 16 and 17 upon the frequency of input signals applied to terminal 14. It can be seen that the phase difference approaches 180° as the resonant frequency of the tuned filter is approached, and falls toward 0° rapidly as the input signal frequency goes further away from resonance. This is due to the end-to-end closed loop series circuit configuration of capacitors 12 and 13 and inductor 15, where one of the capacitors is larger than the other.

Continuing with FIG. 1, there is further shown a differential amplifier 18 having two input terminals, labeled A and B. As shown, junctions 16 and 17 of filter 11 are connected to terminals A and B, respectively. The differential amplifier, which may be any conventional differential amplifier having a high input impedance, provides an output on terminal 19 which represents the difference in amplitude of the instantaneous value of signals appearing at terminals A and B.

Signals which are applied to terminals A and B of differential amplifier 18 with a 180° phase difference are amplified to the maximum extent of the amplifier. As the phase difference diminishes, the instantaneous signal amplitude differences between the two terminals diminishes. At zero phase difference, the signal is cancelled by the differential amplifier. The overall frequency-amplitude response curve of the device will therefore closely follow the phase difference curve described above and is shown in FIG. 2*a*.

The impedance of the tuned filter across the terminals A and B, which varies as the frequency varies, does not affect the input impedance of the entire circuit shown in FIG. 1 taken with respect to ground. Thus, the impedance measured from the input terminal 14 to ground, is unaffected by the frequency of the input signals. This is shown diagrammatically in FIG. 2*c*. It is noted that the input impedance of the differential amplifier with respect to ground determines, to a great extent, the value of the input impedance of the combined circuit. It is further noted that the particular characteristics of the filter 11 which are desired for various applications can be obtained through well known filter calculations and will have negligible effect on the input impedance of the tuned amplifier.

Referring now to FIG. 3, there is illustrated a cascaded network embodying the tuned amplifier of FIG. 1. This type of circuit may be used to provide various band pass characteristics and is typical of cascaded intermediate frequency (IF) stages in radio receivers. The invention is particularly suited to such applications since the input impedance of the last stage will not affect any of the preceding stages. Therefore, identical pretuned circuits can be used and if one stage fails, the last one for example, it can be quickly replaced without necessitating a long and sensitive readjustment of all the preceding stages in the cascaded network.

A further network is shown in FIG. 4 which also uses the tuned amplifier of FIG. 1. In this circuit, the resonant frequency of the various tuned filters is different so that a signal appearing at the input will be segregated into its individual frequency components. This type of circuit is used extensively in telemetry systems to extract received data. As can be seen from the figure, any variation in input impedance of each of the tuned amplifiers would present serious mismatching problems with the source of input signals and would cause a loss of intelligence. With the circuit of the present invention, connected as shown, these problems are eliminated and, as with the cascaded system of FIG. 3, alignment is simplified.

The invention thus provides a simple, reliable tuned filter amplifier which, due to its constant high input impedance, is a flexible tool for the design engineer and is considered to represent a substantial improvement in the art.

Obviously many modifications and variations of the present invention are possible in the light of the above teachings.

What is claimed and desired to be secured by Letters Patent of the United States is:

1. A constant input impedance tuned filter amplifier having a bandwidth centered about a resonant frequency, comprising:

tuned circuit means tuned to said resonant frequency and adapted to receive input signals applied to said tuned filter amplifier, for providing two output signals having a phase difference therebetween which approaches 180° as the input signals approach said resonant frequency and including first and second capacitors of substantially different size and connected together at one end to form a terminal adapted to receive said input signals and an inductor connected to the other ends of said first and second capacitors to form terminals for providing said two output signals; and differential amplifier means adapted to receive said two output signals from said tuned circuit means and having an input impedance which establishes the value of said constant input impedance, for providing signal amplification to said output signals, said amplification having a value which is proportional to said phase difference and is a maximum when said phase difference equals 180°;

whereby those input signals having a frequency within said bandwidth are amplified while those input signals having a frequency outside said bandwidth are suppressed.

2. A frequency separator for receiving a plurality of different frequency input signals at an input terminal, comprising:

a plurality of constant input impedance tuned filter amplifiers coupled to said input terminal, each tuned to amplify a respective one of said plurality of different frequency input signals and each further including:

tuned circuit means tuned to pass a respective one of said plurality of different frequency input signals, for providing two output signals having a phase difference therebetween which approaches 180° as the input signals approach said one frequency, and including first and second capacitors of substantially different size and connected together at one end to form a terminal adapted to receive said input signals and an inductor connected to the other ends of said first and second capacitors to form terminals for providing said two output signals, and differential amplifier means adapted to receive said two output signals from said tuned circuit means and having an input impedance which establishes the value of said constant input impedance, for providing signal amplification to said output signals, said amplification having a value which is proportional to said phase difference and is a maximum when said phase difference equals 180°.

3. A cascaded tuned amplifier circuit, comprising:

a plurality of constant input impedance tuned filter amplifiers coupled in series circuit, each tuned to a resonant frequency and each further including:

tuned circuit means tuned to said resonant frequency for providing two output signals having a phase difference therebetween which approach 180° as input signals applied thereto approach said resonant frequency and including first and second capacitors of substantially different size and connected together at one end to form a terminal adapted to receive said input signals and an inductor connected to the other end of said first and second capacitors to form terminals for providing said two output signals, and differential amplifier means adapted to receive said two output signals from said tuned circuit means and having an input impedance which establishes the value of said constant input impedance, for providing signal amplification to said output signals, said amplification having a value which is proportional to said phase difference and is a maximum when said phase difference equals 180°.

4. A constant input impedance tuned amplifier, comprising:

two capacitors, having values differing by at least one order of magnitude, connected together at one end to form an input terminal;

an inductor connected between the other ends of said capacitors to form a tuned circuit resonant at a particular frequency;

a differential amplifier for establishing said constant input impedance and having a first input coupled to the other end of one of said two capacitors, and a second input coupled to the other end of the other of said two capacitors, and an output terminal;

whereby signals applied to said input terminal within a range of frequencies centered about said resonant frequency are amplified while signals applied to said input terminal outside said range are suppressed.

References Cited

UNITED STATES PATENTS

| | | | |
|---|---|---|---|
| 2,857,517 | 10/1958 | Jorgensen et al. | |
| 3,163,809 | 12/1964 | Theodore et al. | 330—126 X |
| 3,183,449 | 5/1965 | Bray | 307—233 X |
| 3,446,996 | 5/1969 | Toffler | 307—233 |

OTHER REFERENCES

Kyle, "Selective Audio Amplifiers," Electronics World, July 1965, p. 84.

ROY LAKE, Primary Examiner

J. B. MULLINS, Assistant Examiner

U.S. Cl. X.R.

328—138; 330—154